United States Patent
Takeda et al.

(10) Patent No.: US 10,778,224 B2
(45) Date of Patent: Sep. 15, 2020

(54) METHOD FOR LIGHTING BACKLIGHT OF CAPACITIVE TOUCH SWITCH MODULE

(71) Applicants: NORITAKE CO., LIMITED, Aichi (JP); NORITAKE ITRON CORPORATION, Mie (JP)

(72) Inventors: Yukari Takeda, Mie (JP); Toru Kohama, Mie (JP); Kazuhisa Shibata, Mie (JP)

(73) Assignees: NORITAKE CO., LIMITED, Aichi (JP); NORITAKE ITRON CORPORATION, Mie (JP)

( * ) Notice: Subject to any disclaimer, the term of this patent is extended or adjusted under 35 U.S.C. 154(b) by 0 days.

(21) Appl. No.: 16/290,588

(22) Filed: Mar. 1, 2019

(65) Prior Publication Data
US 2019/0273497 A1 Sep. 5, 2019

(30) Foreign Application Priority Data
Mar. 1, 2018 (JP) .................. 2018-036124

(51) Int. Cl.
*H03K 17/96* (2006.01)
(52) U.S. Cl.
CPC .......... *H03K 17/9622* (2013.01); *H03K 2217/960755* (2013.01); *H03K 2217/960785* (2013.01)
(58) Field of Classification Search
CPC ... H03K 17/9622; H03K 2217/960755; H03K 2217/960785
See application file for complete search history.

(56) References Cited

U.S. PATENT DOCUMENTS

| 9,240,296 B2 * | 1/2016 | Krumpelman | ......... H01H 13/70 |
| 10,269,307 B2 * | 4/2019 | Xie | ...................... G09G 3/3413 |
| 2016/0381748 A1 * | 12/2016 | Hagino | .............. H05B 33/0815 315/186 |

FOREIGN PATENT DOCUMENTS

| JP | 2013-062032 A | 4/2013 |
| JP | 2015-084616 A | 4/2015 |

OTHER PUBLICATIONS

English Abstract for JP 2015-084616 A dated Apr. 30, 2015.
English Abstract for JP 2013-062032 A dated Apr. 4, 2013.

* cited by examiner

*Primary Examiner* — Nelson M Rosario
(74) *Attorney, Agent, or Firm* — Hedman & Costigan, P.C.; James V. Costigan; Kathleen A. Costigan (57) ABSTRACT

To provide a method for lighting a backlight of a capacitive touch switch module in which driving of the backlight hardly affects sensitivity of a touch switch.
An electrical noise generated when a LED backlight 6 is driven is suppressed by at least one of (1) setting timings of turning on and/or turning off of pulse waveforms for light emitting diode backlights in a pulse modulation system not to be the same but to be different from each other, and (2) lengthening a time necessary for at least one of rising and falling of the pulse waveform in the pulse modulation system.

6 Claims, 10 Drawing Sheets

CAPACITIVE COUPLING

METHOD FOR LIGHTING BACKLIGHT OF CAPACITIVE TOUCH SWITCH MODULE

CROSS REFERENCE TO RELATED APPLICATION

This application claims priority to Japanese Patent Application No. 2018-036124 filed on Mar. 1, 2018, the entire contents of which are incorporated by reference herein.

TECHNICAL FIELD

The present invention relates to a method for lighting a backlight of a capacitive touch switch module, in particular relates to a method for lighting a backlight of a capacitive touch switch module having an LED backlight.

BACKGROUND ART

In household electrical appliances, audio visual appliances, personal computer equipment, office automation equipment, industrial machines or other electronic devices, a capacitive touch switch module is used as one of input devices to each appliance. The capacitive touch switch module is connected to a microcomputer. The microcomputer converts a change amount of capacitance of each of sensor electrodes served as a switch installed in a touch switch panel, into a numerical value. When the value exceeds a predetermined threshold, the microcomputer determines that a finger touches the touch switch panel.

In order to show clearly that the switch of the touch switch module is activated, a light emitting diode (hereinafter, referred to as an LED) backlight is generally installed at a back side of the sensor electrode. Ina case in which the number of the LED backlights is increased, the touch switch might be affected by the driving of the LEDs thereof.

Conventionally, an LED lighting device provided with a converter capable of executing both of power factor improving control and constant current control necessary for driving a plurality of the LEDs, is known (Japanese Unexamined Patent Application Publication No. 2015-084616). Further, an LED luminaire capable of suppressing generation of EMI by reducing an electromagnetic noise generated in an LED lighting device, is known (Japanese Unexamined Patent Application Publication No. 2013-062032).

SUMMARY OF THE INVENTION

The capacitive touch switch module that measures the change amount of the capacitance of the sensor electrode is in a technical field different from that of the luminaire using the LED because the capacitive touch switch module is largely affected by electromagnetic induction in association with the turning on and/or turning off of the LED.

A ratio of current for the LED against input current to the capacitive touch switch module is apt to be large compared to turning on of the LED or the luminaire. In particular, in a case in which the number of the LED backlights is increased, the most of the input current to the module is used as the current for driving the LED. Thus, an electrical change is caused due to the driving of the LED, and thereby the touch switch detects the electrical change due to the driving of the LED. This might cause malfunction of the touch switch.

Accordingly, an object of the present invention is, in order to solve such a problem, to provide a method for lighting a backlight of a capacitive touch switch module, the capacitive touch switch module having an LED backlight, the method for lighting the back light hardly affecting sensitivity of a touch switch by driving of the backlight.

Means for Solving the Problem

A method for lighting a backlight of a capacitive touch switch module of the present invention, a capacitive touch switch module including a capacitive touch switch panel arranged above or on a circuit board on which a plurality of LED backlights are mounted, and the LED backlight being driven by a pulse modulation system, the method for lighting the backlight of the capacitive touch switch module including suppressing an electrical noise generated when the LED backlight is driven by at least one of (1) setting timings of turning on and/or turning off of pulse waveforms for the light emitting diode backlights in the pulse modulation system not to be the same but to be different from each other, and (2) lengthening a time necessary for at least one of rising and falling of the pulse waveform in the pulse modulation system. Here, a side above or on the circuit board on which the LED backlight is mounted denotes a side of an operator that touches the capacitive touch switch.

The suppressing of the electrical noise may be executed by switching control of a transistor or by operation amplifier control.

Further, a plurality of the light emitting diode backlights may be arranged below a plurality of touch switches of the capacitive touch switch panel.

Effect of the Invention

In the method for lighting the backlight of the capacitive touch switch module of the present invention, the following effects relating to the electrical noise generated when a plurality of the LED backlights is driven can be obtained by setting the timings of the turning on and/or the turning off of the pulse waveform not to be the same but to be different from each other and/or by lengthening the time necessary for at least one of the rising and the falling of the pulse waveform.

(1) Since an inductive noise to the touch switch due to driving of the LED can be decreased, detection sensitivity of the capacitive touch switch can be improved, and therefore an erroneous detection ratio can be decreased.

(2) Since fluctuation of current and voltage due to the driving of the LED can be suppressed, a controller of a microcomputer or the like that detects the touch of the finger is stabled, and therefore the erroneous detection ratio can be decreased.

(3) Since the noise generated from the module itself is decreased, an EMC resistance to the noise received by the capacitive touch switch module can be improved.

(4) Since an operation margin of the touch switch is increased, malfunction in a manufacturing process or in a market can be decreased.

DETAILED DESCRIPTION OF THE EMBODIMENT

Figure 1:
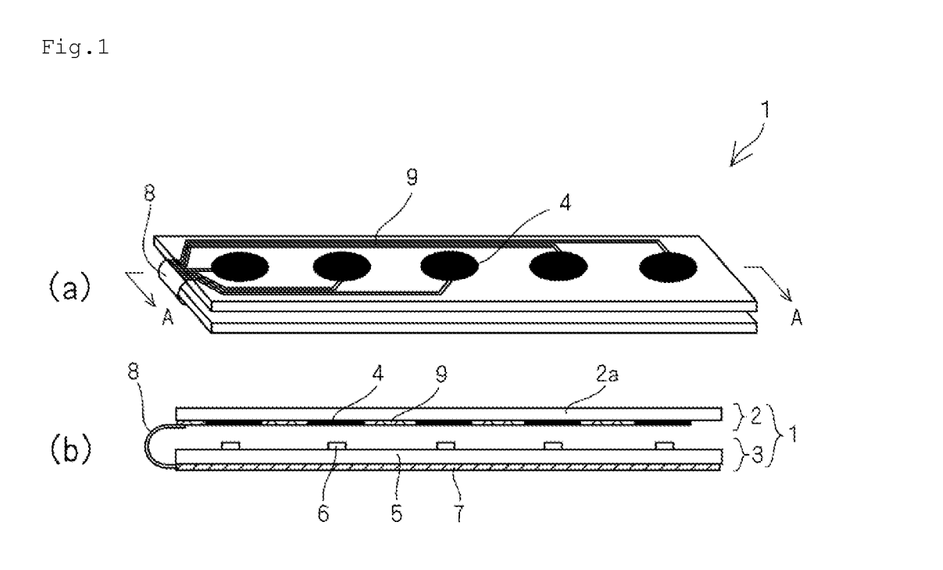
FIGS. 1(a) and 1(b) are views illustrating a capacitive touch switch module.

FIGS. 1(a) and 1(b) show one example of a capacitive touch switch module of the present invention. FIG. 1(a) is a perspective view, and FIG. 1(b) is a cross-sectional view taken along line A-A shown in FIG. 1(a). A capacitive touch switch module 1 shown in FIGS. 1(a) and 1(b) is provided with a touch switch panel 2, an LED backlight, and a touch switch control circuit board (hereinafter, referred to as an LED backlight circuit board) 3.

In the touch switch panel 2, a sensor electrode and a switch design 4 (hereinafter, referred to as a sensor electrode) are formed on a back surface of a light transmittable cover 2a formed of glass or the like by means of printing, laser trimming or the like. The sensor electrode 4 is connected to a touch switch control wiring network 9. The LED backlight circuit board 3 is formed by a printed circuit board (PCB) 5 on which a plurality of LED backlights 6 corresponding to the sensor electrodes 4 is mounted. The LED backlight and a touch switch controller (hereinafter, referred to as a controller) 7 are mounted on the printed circuit board 5. The touch switch panel 2 and the LED backlight circuit board 3 are connected through a connecter 8 such as an FPC and the like. The controller 7 drives the LED backlight 6 by a pulse modulation system. Here, the driving by the pulse modulation system denotes that the LED backlight 6 is driven by a pulse waveform with a pulse width modulated.

In the capacitive touch switch module 1 having the configuration described above, when a front surface of the cover 2a is touched by a finger, electrostatic coupling is generated between the sensor electrode 4 and the finger and thereby capacitance of the electrode is changed. The sensor electrodes 4 are arranged at plural positions so as to correspond to the switch design. Each of the sensor electrodes 4 is connected to the LED backlight circuit board 3 through the wiring network 9 and the connector 8. A change amount of the capacitance of the sensor electrode 4 is converted into a numerical value by the LED backlight circuit board 3, and when the value exceeds a predetermined threshold, it is determined that the finger touches the cover 2a. Accordingly, the capacitive touch switch module 1 can detect that the capacitance of which sensor electrode 4 is changed and therefore can detect that the finger touches which touch switch.

The LED backlight circuit board 3 for clearly showing that the sensor electrode 4 (the switch design) of the touch switch panel 2 is activated is mounted on the capacitive touch switch module 1. The touch switch panel 2 and the LED backlight circuit board 3 are arranged in this order when seen from a side of an operator touching the capacitive touch switch. When the sensor electrode 4 is touched, turning on, turning off, changing a brightness, flickering or the like of the LED backlight 6 is executed so as to inform that the switch is pressed. The current for driving the LED backlight 6 mounted on the LED backlight circuit board 3 is larger than the current for controlling the touch switch panel. In particular, in a case in which many LED backlights 6 are mounted, a ratio of the current for the LED against the input current to the module is apt to be larger, and therefore the most of the input current is used for the current for driving the LED.

Figure 2:
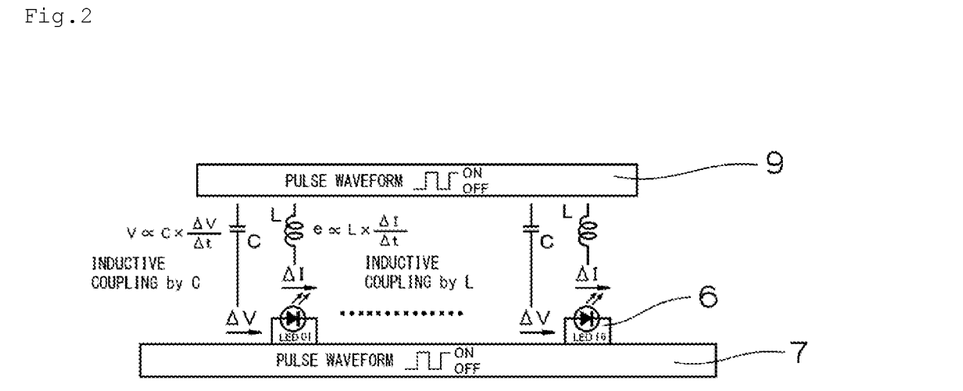
FIG. 2 is an electrical relationship of a wiring network of a panel and an LED circuit board.

FIG. 2 shows a relationship between the touch switch control wiring network 9 of the touch switch panel 2 and the controller 7 of the LED backlight circuit board 3 in the capacitive touch switch module 1. FIG. 2 is an electrical relationship of the wiring network 9 and the controller 7.

When a pulse waveform for executing turning on, turning off, changing a brightness, flickering or the like of the LED backlight 6 is turned on and/or turned off, fluctuation $\Delta I$ of the current is generated. When the current is supplied, fluctuation $\Delta V$ of voltage is also generated. There are capacitive coupling by the capacitance C and inductive coupling by inductance L between the wiring network 9 of the touch switch panel 2 and the controller 7 of the LED backlight circuit board 3. The capacitive coupling can be made small by decreasing the capacitance C. The inductive coupling can be made small by decreasing the inductance L.

The capacitive coupling and the inductive coupling can be made small by setting a distance between the touch switch panel 2 and the LED backlight circuit board 3 to be large. However, in such a case, it is necessary to arrange the LED backlight circuit board 3 and the LED backlight 6 under the touch switch panel 2. Further, the distance between the touch switch panel 2 and LED backlight circuit board 3 shown in FIGS. 1(a) and 1(b) is needed to be made small due to its thickness restriction. Thus, in a most case of the capacitive touch switch module 1 in recent years, it is difficult to set the capacitive coupling and the inductive coupling to be small.

As shown in FIG. 2, the inductive coupling is a phenomenon in which the current with the pulse waveform is supplied to the controller 7 of the LED backlight circuit board 3 and thereby inductive voltage e is induced in the wiring network 9 of the touch switch panel 2 by the fluctuation $\Delta I$ of the current. The inductive voltage e is proportional to the product of the inductance L and ($\Delta I/\Delta t$). $\Delta t$ is a time necessary for turning on and/or turning off of the pulse waveform. That is, $\Delta t$ is a time necessary for rising and/or falling of the pulse waveform. The inductance L is defined by a structure of the assembled module, and therefore the inductive voltage e is proportional to a current change per unit time (=$\Delta I/\Delta t$). Accordingly, the inductive voltage e can be made small by decreasing $\Delta I$ and/or by increasing $\Delta t$.

As shown in FIG. 2, the capacitive coupling is a phenomenon in which the current with the pulse waveform is supplied to the controller 7 of the LED backlight circuit board 3 and thereby inductive voltage V is induced in the wiring network 9 of the touch switch panel 2 by the fluctuation $\Delta V$ of the voltage caused by the fluctuation $\Delta I$ of the current. The inductive voltage V is proportional to the product of the capacitance C and ($\Delta V/\Delta t$). $\Delta t$ is a time necessary for turning on and/or turning off of the pulse waveform. That is, $\Delta t$ is a time necessary for rising and/or falling of the pulse waveform. The capacitance C is defined by a structure of the assembled module, and therefore the inductive voltage V is proportional to a voltage change per unit time (=$\Delta V/\Delta t$). Accordingly, the inductive voltage V can be made small by decreasing $\Delta V$ and/or by increasing $\Delta t$.

Figure 3:
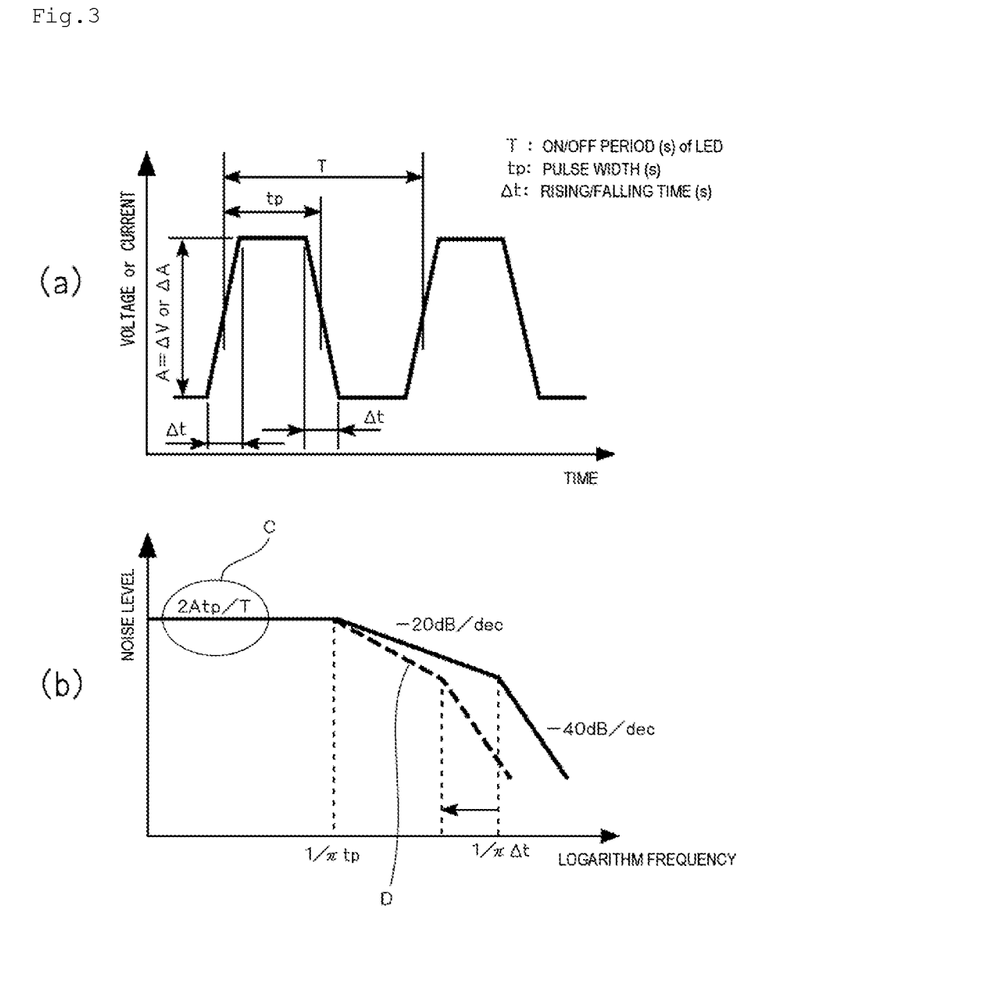
FIGS. 3(a) and 3(b) are graphs illustrating a relationship between a pulse waveform and a noise.

The inductive voltage V and the inductive voltage e are turned into an electrical noise generated when the LED backlight is driven. The noise is apt to be caused when lighting a plurality of the LEDs. FIGS. 3(a) and 3(b) show a relationship between the pulse waveform and the noise. FIG. 3(a) shows the pulse waveform, and FIG. 3(b) shows a noise level against a frequency.

The noise level can be made small by decreasing a value of A ($=\Delta V$ or $\Delta A$) in C shown in FIG. 3(b). The present invention can decrease the value of A by setting the timings of the turning on and/or the turning off of the pulse waveforms for the LED backlights in the pulse modulation system not to be the same but to be different from each other, so that the noise level can be decreased. Further, as shown by D in FIG. 3(b), the noise frequency can be decreased by setting $\Delta t$ to be longer. As the frequency is higher, the cause of the noise apt to be emitted can be suppressed.

Figure 4:
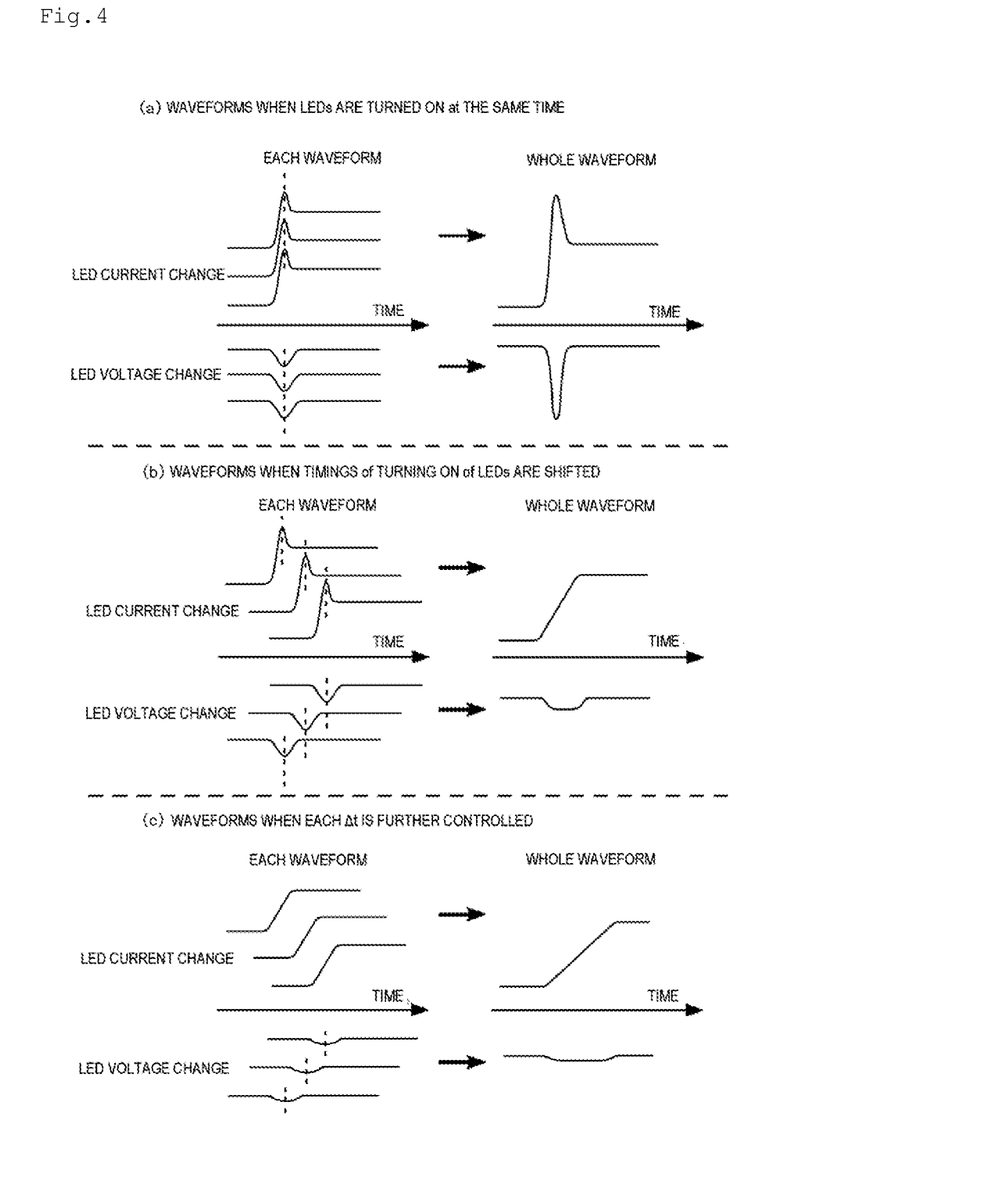
FIGS. 4(a) through 4(c) are views illustrating waveforms when lighting a plurality of LEDs.

FIGS. 4(a) through 4(c) show waveforms when lighting a plurality of the LEDs. FIG. 4(a) shows waveforms when a plurality of the LEDs is turned on at the same time. FIG. 4(b) shows waveforms when the timings of the turning on of the LEDs are shifted from each other. FIG. 4(c) shows waveforms when each $\Delta t$ is further controlled. In FIGS. 4(a) through 4(c), the individual LED waveform is shown at a left side of each figure, the whole waveform is shown at a right side of each figure, an LED current change is shown above a time axis, and an LED voltage change is shown below the time axis.

As in the conventional example, when a plurality of the LEDs is turned on at the same time (FIG. 4(a)), respective peaks of the current waveforms are superposed. Further, the fallings of the voltages are superposed. As a result, in the whole waveform, the peak of the current waveform becomes large and the falling of the voltage becomes large, and thereby large noise is generated.

Contrary to the case in which a plurality of the LEDs is turned on at the same time, when the timings of the turning on of the LEDs are shifted from each other (FIG. 4(b)), each of the peaks of the current waveforms and the fallings of the voltages are not superposed. The peak is inconspicuous in the whole waveform. In the whole waveform, an incline of the rising of the current becomes gentle, and thereby the noise is decreased. Similarly, the fallings of the voltages are dispersed, and thereby the noise is decreased.

Against the configuration of FIG. 4(b), when each $\Delta t$ is further controlled (FIG. 4(c)), the peak does not exist in each waveform, and thereby the falling of the voltage is decreased. In addition, the frequency can be adjusted so as not to affect the touch switch control by controlling $\Delta t$. Further, the fallings of the voltages are further dispersed. As a result, the noise can be further decreased.

The sensor electrodes 4 to be a plurality of the touch switches are arranged in the touch switch panel 2. The backlights 6 are arranged on the LED backlight circuit board 3 so as to correspond to the sensor electrodes 4. Here, the fluctuation $\Delta I$ of the current and the fluctuation $\Delta V$ of the voltage per one LED backlight are generated. In a case in which n LED backlights are mounted and n LED backlights are turned on at the same time, n times of the fluctuation of the current and n times of fluctuation of voltage are generated. For example, when sixteen LED backlights are turned on at the same time, the fluctuation of $16 \times \Delta I$ and the fluctuation of $16 \times \Delta V$ are generated. That is, in the wiring network 9 of the touch switch panel 2, the inductive voltage e proportional to $16 \times (\Delta I/\Delta t)$ is generated by the inductive coupling, and the inductive voltage V proportional to $16 \times (\Delta V/\Delta t)$ is generated by the capacitive coupling. The inductive voltage V and the inductive voltage e are turned into the electrical noise, and thereby the detection sensitivity of the touch switch panel 2 is deteriorated.

Figure 5:
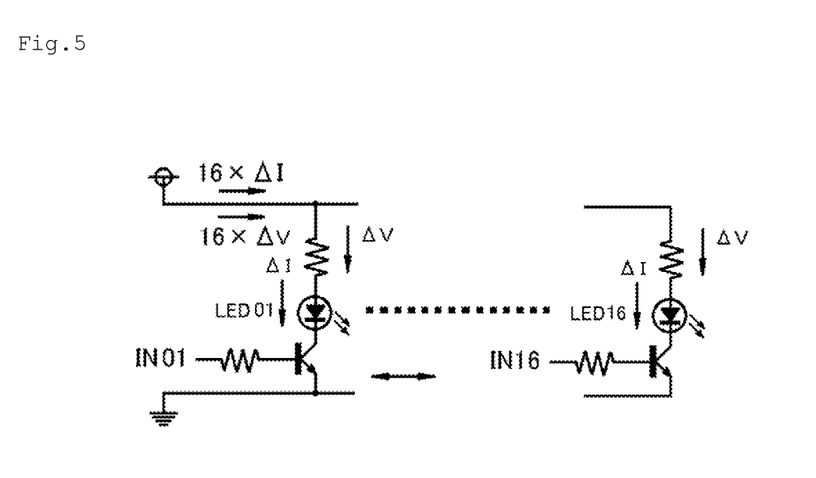
FIG. 5 is a circuit diagram of a switching element (transistor).
Figure 6:
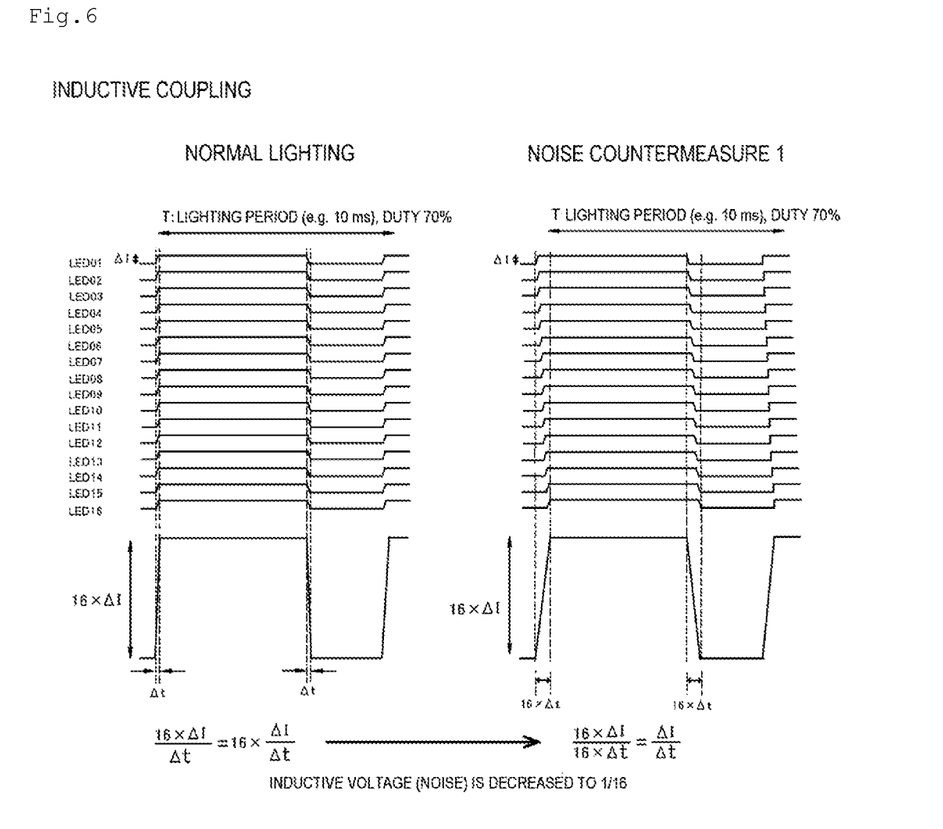
FIG. 6 is a view illustrating a relationship between an inductive coupling and a pulse waveform.
Figure 7:
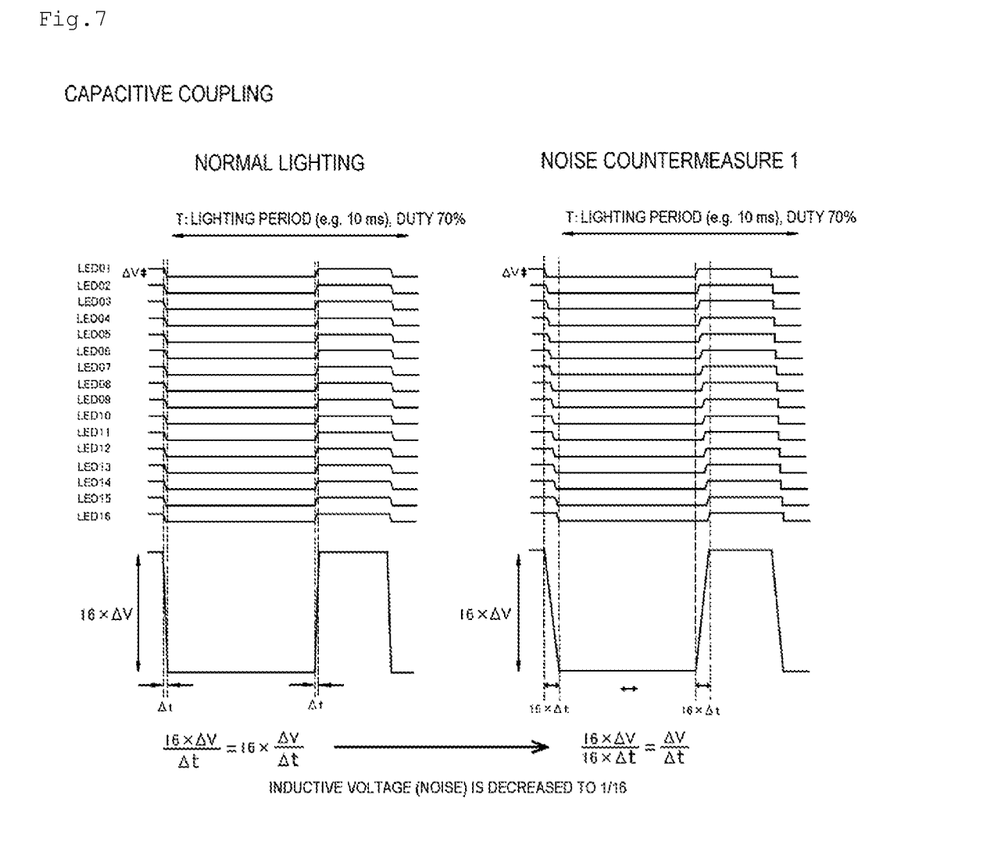
FIG. 7 is a view illustrating a relationship between a capacitive coupling and a pulse waveform.

As one method for suppressing the electrical noise generated when the LED backlight is driven, there is a method in which the timings of the turning on and/or the turning off of the pulse waveforms for the sixteen LED backlights are set not to be the same but to be different from each other by using a switching element (transistor). This method is described as a countermeasure 1 with reference to FIG. 5 through FIG. 7. FIG. 5 shows a circuit diagram of the switching element (transistor). FIG. 6 shows a relationship between the inductive coupling and the pulse waveform. FIG. 7 shows a relationship between the capacitive coupling and the pulse waveform. In FIG. 6 and FIG. 7, $\Delta t$ is shown in an enlarged state.

In the switching element using a transistor shown in FIG. 5, sixteen LED backlights are driven at a lighting period T of 10 ms and a duty of 70%. $\Delta t$, which is a time necessary for turning on and/or tuning off of the transistor, is extremely short compared to the lighting period. For example, when the lighting period is 10 ms and $\Delta t$ is 100 ns, $\Delta t/T$ is 0.001% and $16 \times \Delta t/T$ is 0.016%. As a result, even in a case in which the lighting timings are sequentially shifted as a method for lighting the LEDs at different timings, an influence to a visual aspect can be ignored.

In each of FIG. 6 and FIG. 7, pulse waveforms for lighting sixteen LEDs at the same time are shown at a left side as "Normal lighting", and pulse waveforms of the noise countermeasure 1 are shown at a right side as "Noise countermeasure 1". FIG. 6 shows a result of the inductive coupling. FIG. 7 shows a result of the capacitive coupling.

In the noise countermeasure 1, each of the turning on timing and/or the turning off timing of the transistor is shifted sequentially by $\Delta t$. That is, the time order of the lighting start times of the LEDs is set such that LED01→$\Delta t$→LED02→ . . . →$\Delta t$→LED16.

According to the result of the noise countermeasure 1, the generation of the inductive voltage e in association with the lighting of the LED backlight can be decreased to $\frac{1}{16}$ (FIG. 6) because the inductive voltage e is proportional to the product of the inductance L and ($\Delta I/\Delta t$). Similarly, the generation of the inductive voltage V in association with the lighting of the LED backlight can be decreased to $\frac{1}{16}$ (FIG. 7) because the inductive voltage V is proportional to the product of the capacitance C and ($\Delta V/\Delta t$).

Figure 8:
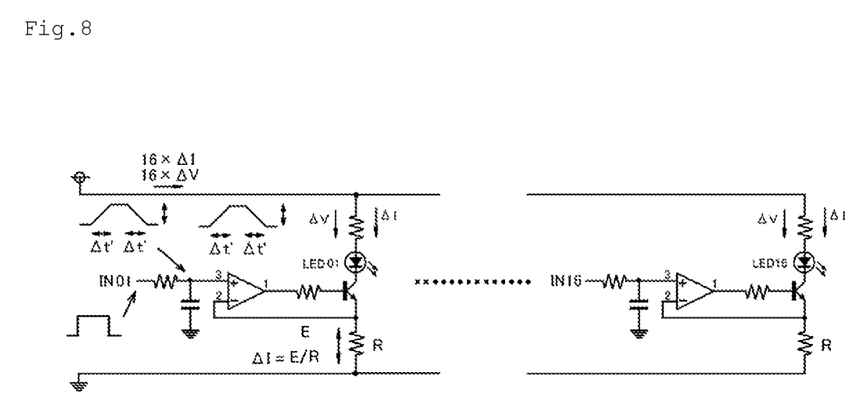
FIG. 8 is a circuit diagram illustrating operation amplifier control.

FIG. 8 shows a circuit diagram illustrating operation amplifier control. FIG. 8 shows an example of an operation amplifier circuit into which a voltage follower circuit is installed. The voltage follower circuit includes a negative feedback circuit connecting a minus (−) terminal and an output terminal of the operation amplifier circuit. The time necessary for the turning on and/or the turning off of the transistor element can be adjusted by the operation amplifier voltage follower circuit. That is, $\Delta t$ can be lengthened to $\Delta t'$, which is n times of $\Delta t$. In the voltage follower circuit, a shape of the current waveform is similar to that of a waveform input to a plus (+) terminal of the operation amplifier. In a case in which the time necessary for turning on and/or turning off in the input waveform is $\Delta t'$, the time necessary for turning on and/or turning off in the current waveform is also $\Delta t'$. For example, when the lighting period is 10 ms and $\Delta t'$ is 400 ns, which is four times of $\Delta t$, $\Delta 16 \times \Delta t'/T$ is 0.064%. As a result, even in a case in which the time necessary for turning on and/or turning off is lengthened, an influence to a visual aspect can be ignored.

Figure 9:
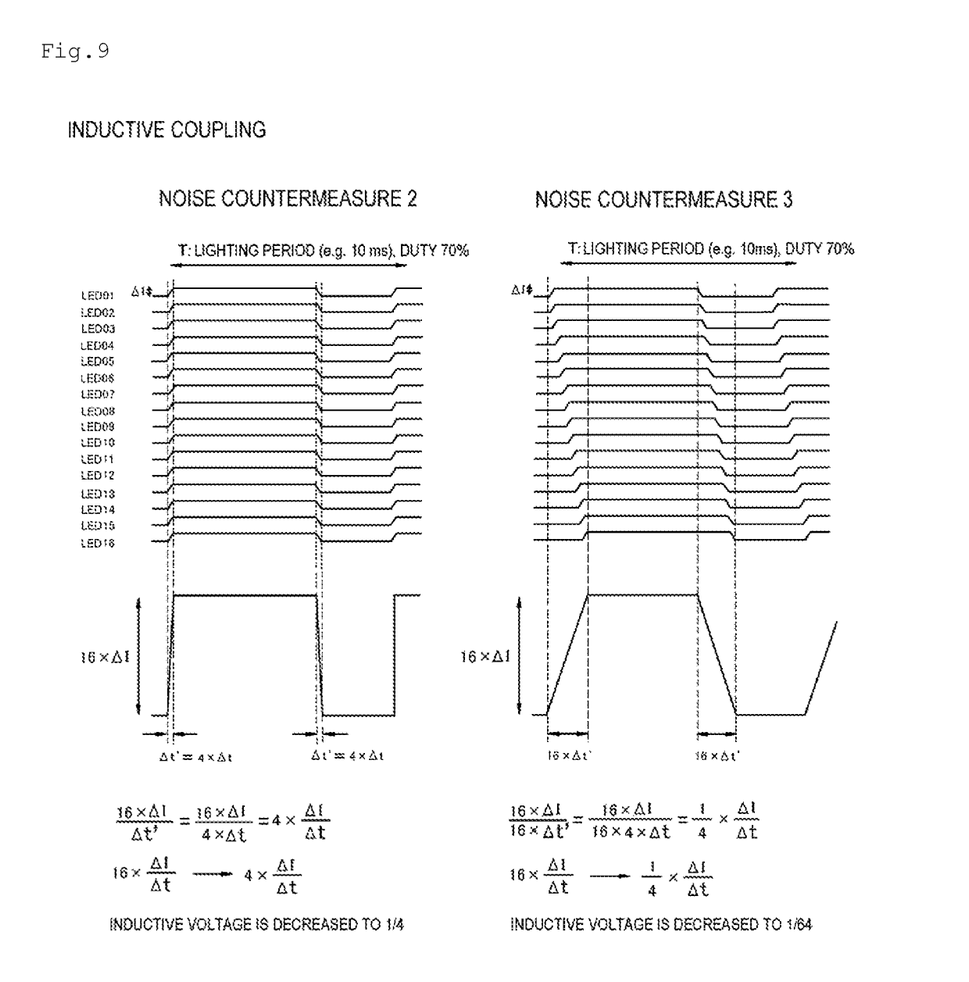
FIG. 9 is a view illustrating a result of an inductive coupling when each of noise countermeasures 2 and 3 is executed.
Figure 10:
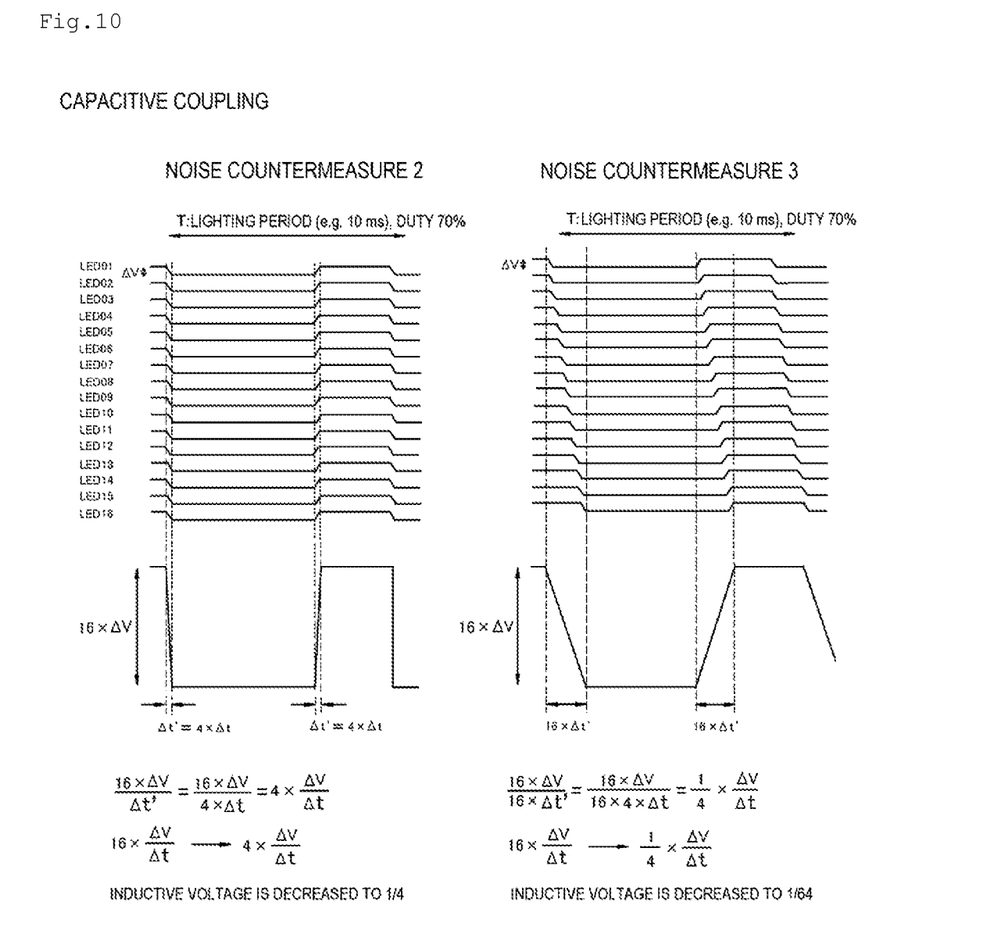
FIG. 10 is a view illustrating a result of a capacitive coupling when each of the noise countermeasures 2 and 3 is executed.

FIG. 9 and FIG. 10 show a noise countermeasure 2 and a noise countermeasure 3, each of which uses the operation amplifier control. FIG. 9 shows a result of the inductive coupling when the noise countermeasures 2 and 3 are executed. FIG. 10 shows a result of the capacitive coupling when the noise countermeasures 2 and 3 are executed.

In the noise countermeasure 2, the time necessary for turning on and/or turning off of the transistor element is lengthened to Δt', which is four times of Δt. In the noise countermeasure 3, the time necessary for the turning on and/or the turning off of the transistor element is set to Δt', and the timings of the turning on and/or tuning off are shifted by Δt'. The number of the LED backlights, the lighting period T and the duty are the same as those in the noise countermeasure 1.

According to the result of the noise countermeasure 2, the generation of each of the inductive voltage e and the inductive voltage V in association with the lighting of the LED backlight can be decreased to ¼ (FIG. 9 and FIG. 10).

According to the result of the noise countermeasure 3, the generation of each of the inductive voltage e and the inductive voltage V in association with the lighting of the LED backlight can be decreased to 1/64 (FIG. 9 and FIG. 10).

The method for lighting the backlight of the capacitive touch switch module of the present invention can decrease the electrical noise generated when the LED backlight is driven, and therefore superior detection sensitivity can be obtained. As a result, the present invention can be adopted in any capacitive touch switch module having the LED backlight.

REFERENCE SIGNS LIST

1: capacitive touch switch module
2: touch switch panel
3: LED backlight and touch switch control circuit board
4: sensor electrode and switch design
5: printed circuit board
6: LED backlight
7: LED backlight and touch switch controller
8: connector
9: touch switch control wiring network

The invention claimed is:

1. A method for lighting a backlight of a capacitive touch switch module,
   having in the capacitive touch switch module, a capacitive touch switch panel being arranged above or on a circuit board on which a plurality of light emitting diode backlights are mounted,
   the light emitting diode backlight being configured to be driven by a pulse modulation system, the method for lighting the backlight of the capacitive touch switch module comprising suppressing an electrical noise generated when the light emitting diode backlight is driven by at least one of:
   (1) setting timings of turning on and/or turning off of pulse waveforms for the light emitting diode backlights in the pulse modulation system not to be the same but to be different from each other; and
   (2) lengthening a time necessary for at least one of rising and falling of the pulse waveform in the pulse modulation system.

2. The method for lighting the backlight of the capacitive touch switch module according to claim 1, wherein the suppressing of the electrical noise is executed by switching control of a transistor.

3. The method for lighting the backlight of the capacitive touch switch module according to claim 1, wherein the suppressing of the electrical noise is executed by operation amplifier control.

4. The method for lighting the backlight of the capacitive touch switch module according to claim 1, wherein a plurality of the light emitting diode backlights is arranged below a plurality of touch switches of the capacitive touch switch panel.

5. The method for lighting the backlight of the capacitive touch switch module according to claim 2, wherein a plurality of the light emitting diode backlights is arranged below a plurality of touch switches of the capacitive touch switch panel.

6. The method for lighting the backlight of the capacitive touch switch module according to claim 3, wherein a plurality of the light emitting diode backlights is arranged below a plurality of touch switches of the capacitive touch switch panel.

* * * * *